(12) United States Patent
Akiyama

(10) Patent No.: US 6,349,271 B1
(45) Date of Patent: Feb. 19, 2002

(54) METHOD AND APPARATUS FOR SIMULATING AN OXIDATION PROCESS IN A SEMICONDUCTOR DEVICE MANUFACTURING STEP

(75) Inventor: Yutaka Akiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/118,928

(22) Filed: Jul. 20, 1998

(30) Foreign Application Priority Data

Jul. 18, 1997 (JP) ............................................. 9-193893

(51) Int. Cl.$^7$ .......................... G06F 7/60; G06F 17/10; G06F 101/00
(52) U.S. Cl. .............................. 703/2; 703/13; 702/84; 117/201
(58) Field of Search ........................... 702/84; 117/201; 703/13, 14, 15, 20; 763/13–15, 20, 2; 716/1

(56) References Cited

U.S. PATENT DOCUMENTS

| | | | | |
|---|---|---|---|---|
| 5,408,952 A | * | 4/1995 | Wakabayashi et al. ...... | 117/201 |
| 5,511,005 A | * | 4/1996 | Abbe et al. .................... | 702/84 |
| 5,930,494 A | * | 7/1999 | Akiyama ............... | 395/500.28 |
| 6,011,914 A | * | 1/2000 | Akiyama ............... | 395/500.35 |

OTHER PUBLICATIONS

Dimitrijev et al, "Extension of the Deal–Grove Oxidation Model to Include the Effects of Nitrogen", IEEE Transactions on Electron Devices, vol. 43 Issue 2, pp. 267–272 (Feb. 1996).*
M. Morisue, "VLSI Designing/Manufacturing Simulation", CMC K.K., 1987, pp. 50–63.
S. Isomae, "Semiconductor Process Device Simulation Technique", REALIZE publisher, 1990, pp. 79–89.
Daeje Chin et al., "Two–Dimensional Oxidation", *IEEE Transactions on Electron Devices*, vol. ED–30, No. 7, Jul. 1983, pp. 744–749.

* cited by examiner

Primary Examiner—Kevin J. Teska
Assistant Examiner—Samuel Broda
(74) Attorney, Agent, or Firm—Sughrue Mion, PLLC

(57) ABSTRACT

In a process simulating method for simulating an oxidation process of a semiconductor device manufacturing step, even when the respective elements of this semiconductor device own arbitrary shapes, a time step of an oxidizing agent diffusion within an oxide film can be properly calculated in the oxidation process. The oxidation process simulating method includes a first step in which a two-dimensional Laplace equation related to an oxidizing agent diffusion within an oxide film is solved to calculate oxidizing agent concentration $C^S_{OX}$ at a boundary surface between an oxide film/a silicon substrate; a second step in which the oxidizing agent density $C^S_{OX}$ is substituted for formula (1) to calculate an effective film thickness of the oxide film as to all of a plurality of preset modes on the boundary surface between the oxide film/the silicon substrate, and a parameter related to an oxidation speed is equal to "A" given by the below-mentioned formula (2)

$$T^E_{ox} = \frac{A}{2} \frac{\frac{h}{h+k} \cdot C^* - C^S_{ox}}{C^S_{ox}}, \text{ and} \quad (1)$$

$$A = 2D\left(\frac{1}{h} + \frac{1}{k}\right); \text{ and} \quad (2)$$

a third step for calculating a minimum value $T^M_{OX}$ of the film thickness $T^E_{OX}$ and a fourth step in which both the minimum value $T^M_{OX}$ and a desirable film thickness increase amount $\Delta T_{OX}$ of the oxide film per a time step $\Delta t$ are substituted for the below-mentioned formula (3) to thereby calculate the time step "$\Delta t$", the time step "$\Delta t$" being equal to unit time of the oxidizing agent diffusion within the oxide film in the oxidation process.

$$\Delta t = \left(\frac{2T^M_{ox} + A}{B}\right) \Delta T_{ox}. \quad (3)$$

20 Claims, 5 Drawing Sheets

METHOD AND APPARATUS FOR SIMULATING AN OXIDATION PROCESS IN A SEMICONDUCTOR DEVICE MANUFACTURING STEP

BACKGROUND OF THE INVENTION

1. Field of the Invention

The present invention generally relates to a process simulating method, a process simulator, and a recording medium for recording a process simulation program. More specifically, the present invention is directed to such a process simulating method for simulating an oxidation process in a semiconductor device manufacturing step for an LSI and the like. Also, the present invention is directed to a process simulator for the above-described process simulating method, and also to a recording medium for recording a process simulation program.

2. Description of the Related Art

Conventionally, process simulators are practically available in order to predict internal physical amounts and shapes such as impurity profiles of various elements for constituting semiconductor devices such as LSIs by calculating an oxidation process, a diffusion process, an ion implantation process in manufacturing steps of these LSIs with employment of computers. When such a process simulator is employed, manufacturing processes of the respective elements for constituting the semiconductor device such as the LSI can be optimized as a desk plan in such a manner that the semiconductor device such as the LSI has a desirable electric characteristic. As a consequence, the manufacturing cost can be considerably reduced and the time can be largely shortened, as compared with the actual manufacture of the semiconductor device as a trial case.

To calculate the manufacturing steps for the various sorts of elements by using the computer, the model formulae have been installed in the process simulator with respect to each of the processes. Among these processes, as to the oxidation process, for example, the following simulation method is known. That is, the formula of Deal-Grove (see formula (22)) disclosed in Japanese publication "VLSI Designing/Manufacturing Simulation" written by M. MORISUE issued by CMC K. K., in 1987, pages 62 to 63 is differentiated with respect to time to thereby obtain the formula (23). Then, this formula (23) is solved to simulate the temporal change in the film thickness of the silicon oxide film (SiO$_2$, simply referred to as an "oxide film" hereinafter).

In the formulae (22) and (23), symbol "t" indicates a time instant in the oxidation process, symbol "$T_{OX}$" shows a film thickness of an oxide film at a present time instant, and symbol "$T^P_{OX}$" indicates a film thickness of an oxide film at a preceding time instant, and also symbols "A" and "B" are parameters related to oxidation speed. The formula (23) is applied to an one-dimensional oxidation case such that a flux of an oxidizing agent does not depend upon a place:

$$T_{OX}^2 + A T_{OX} = B(t+\tau) \tag{22}$$

$$\frac{dT_{OX}}{dt} = \frac{B}{(2T^P_{OX} + A)} \tag{23}$$

On the other hand, very recently, in connection with the high integration in semiconductor devices such as LSIs and VLSIs, namely in conjunction with very fine structures of structural elements for constituting these semiconductor devices, these structural elements are isolated by employing LOCOS (Local Oxidation of Silicon) structures and trench structures in order to avoid electrical adverse influences caused by these structural elements. As a consequence, also in process simulators, oxide film shapes in these LOCOS structures and trench structures are required to be simulated. When these oxide film shapes are simulated, since fluxes of oxidizing agents differ from each other, depending on places, the simulation for the oxide film shapes should be carried out at least in the two-dimensional manner, which is completely different from the one-dimensional oxidation.

The two-dimensional oxidation simulation as to the LOCOS structure is disclosed in Japanese publication "Semiconductor Process Device Simulation Technique" written by S. ISOMAE, published by REALIZE publisher, in 1990, on pages 79 to 89. Also, the method for determining the time step "Δt" equal to the unit time of the oxidizing agent diffusion within the oxide film during the oxidation process is described in "Two-Dimensional Oxidation" by DAEJE CHIN et al., IEEE TRANSACTIONS ON ELECTRON DEVICES, VOL. ED-30, No. 7, July 1983.

Now, the conventional two-dimensional oxidation process simulating method disclosed in the last-mentioned publication will be described with reference to a flow chart shown in FIG. 5 and a sectional structure view of an LSI under manufacture indicated in FIG. 6.

In the flow chart of FIG. 5, at the first step SA1, the time instant variable "t" used to count up a time elapse in the oxidation process is set to zero. Subsequently, the simulating operation is advanced to the step SA2. At this step SA2, the Laplace equation indicated in the above-described formula (24) as to the oxide film 1 is solved to calculate oxidizing agent (oxidant) density $C^S_{OX}$ at the boundary surface between the oxide film 1 and the silicon substrate 2 (will be referred to as "a boundary surface between an oxide film/a silicon substrate" hereinafter). Then, the simulating operation is advanced to the further step SA3. In the following formula (24), symbol $D_{OX}$ shows the diffusion coefficient of the oxidizing agent within the oxide film 1:

$$D_{OX} \nabla^2 C_{OX} = 0 \tag{24}$$

At the step SA3, the film thickness $T^S_{OX}$ of the oxide film 1 of the side wall in the LOCOS structure at the time instant "t" is calculated. Thereafter, the process operation is advanced to the step SA4.

At the step SA4, the calculated value of this film thickness $T^S_{OX}$ is substituted for the below-mentioned formula (25) so as to calculate the time step "Δt" equal to the unit time of the oxidizing agent diffusion within the oxide film 1 during the oxidation process. Subsequently, the simulating process is advanced to the step SA5. It should be understood that symbol "$\Delta T_{OX}$" shown in the formula (25) is a desirable film thickness increase amount of the oxide film 1 per 1 time step Δt. This formula (25) is substantially same as the formula [23] disclosed in page 748 of the last-mentioned publication "Two-Dimensional Oxidation".

$$\Delta t = \left( \frac{2T^S_{OX} + A}{B} \right) \Delta T_{OX} \tag{25}$$

At the step SA5, the time instant "t" is advanced only by the time step Δt. In other words, after the time step Δt is added to the time instant variable "t", this simulating process is advanced to the step SA6.

At this step SA6, after the calculation is made of deformation in the shape of the oxidation film as to the time instant "t", the simulating process is advanced to the further step SA7.

At this step SA7, the judgment is made as to whether or not the time instant "t" reaches an ending time instant of the oxidation process. If the judgment result is "NO", then the simulating process is returned to the step SA2, at which the process operations defined from the step SA2 to the step SA6 are repeatedly performed. Then, in the case that the time instant "t" has reached the ending time instant of the oxidation process, since the judgement result of the step SB8 becomes "YES", a series of simulation work is accomplished.

As previously explained, in accordance with the conventional process simulating method, as indicated in FIG. 6, the time step "Δt" is determined in such a manner that the increased value of the film thickness $T^S_{OX}$ of the oxide film of the side wall in the LOCOS structure is continuously made equal to the film thickness $\Delta T_{OX}$.

On the other hand, in the above-explained conventional process simulating method, the film thickness $T^S_{OX}$ of the side wall in the LOCOS structure is employed as the present film thickness of the oxide film 1 which is required to determine the time step "Δt". As a consequence, this conventional process simulating method owns such a drawback that this process simulating method cannot be applied to any of the oxidation process simulation methods. That is, when the respective structural elements for constituting a semiconductor device such as an LSI own arbitrary shapes other than the LOCOS structure, this conventional oxidation process simulating method cannot be used to simulate this oxidation process.

SUMMARY OF THE INVENTION

The present invention has been made to solve the above-described problem, and therefore, has an object to provide a process simulating method, a process simulator, and a recording medium for recording a process simulation program, capable of properly calculating a time step in an oxidation process even when the respective structural elements for constituting a semiconductor device such as an LSI own arbitrary shapes.

To achieve the above-described object, a process simulating method, as recited in claim 1 of the present invention, is featured by such a process simulating method for simulating an oxidation process in a step for manufacturing a semiconductor device, comprising: a first step in which a two-dimensional Laplace equation related to an oxidizing agent diffusion within an oxide film is solved to thereby calculate oxidizing agent concentration $C^S_{OX}$ at a boundary surface between an oxide film/a silicon substrate; a second step in which the oxidizing agent density $C^S_{OX}$ is substituted for the below-mentioned formula (1) so as to calculate an effective film thickness of the oxide film as to all of a plurality of preset modes on the boundary surface between the oxide film/the silicon substrate; the formula (1) is defined by such that equilibrium oxidizing agent concentration within the oxide film is "C*", an oxidation reaction coefficient at the boundary surface between the oxide film/the silicon substrate is "k", a mass transfer coefficient at a boundary surface between an atmosphere/an oxide film is "h", a diffusion coefficient of an oxidizing agent within the oxide film is "D", and a parameter related to an oxidation speed is equal to "A" given by the below-mentioned formula (2):

$$T^E_{OX} = \frac{A}{2} \cdot \frac{\frac{h}{h+k} \cdot C^* - C^S_{OX}}{C^S_{OX}}, \text{ and} \quad (1)$$

$$A = 2D\left(\frac{1}{h} + \frac{1}{k}\right); \quad (2)$$

a third step for calculating a minimum value $T^M_{OX}$ of the film thickness $T^E_{OX}$; and a fourth step in which both the minimum value $T^M_{OX}$ and a desirable film thickness increase amount $\Delta T_{OX}$ of the oxide film per a time step Δt are substituted for the below-mentioned formula (3) to thereby calculate the time step "Δt", the time step "Δt" being equal to unit time of the oxidizing agent diffusion within the oxide film in the oxidation process;

$$\Delta t = \left(\frac{2T^M_{OX} + A}{B}\right)\Delta T_{OX}, \quad (3)$$

wherein: another parameter B related to an oxidation speed, expressed in a right hand of the above-described formula (3), is given by the below-mentioned formula (4), and symbol "$N_1$" shown in a right hand of the below-mentioned formula (4) is a parameter determined by an oxidation sort:

$$B = \frac{2DC^*}{N_1}. \quad (4)$$

Also, to achieve the above-described object, a process simulating method, as recited in claim 2 of the present invention, is featured by the process simulating method according to claim 1 wherein: the process simulating method is comprised of, instead of the fourth step, a fifth step in which the minimum value $T^M_{OX}$, a maximum film thickness increase amount $\Delta T^{MM}_{OX}$ and also a minimum film thickness increase amount $\Delta T^M_{OX}$ with respect to the oxide film thickness increase amount $\Delta T_{OX}$, and a preceding time step $\Delta t^P$ are substituted for the below-mentioned formula (5) related to a maximum time step $\Delta t^{MM}$, the below-described formula (6) related to a minimum time step $\Delta t^M$, and the below-mentioned formula (7) directed to such a time step Δt which should be calculated when a ratio of a present time step to the preceding time step $\Delta t^P$ is assumed as "R", whereby the time step Δt is calculated:

$$\Delta t^{MM} = \left(\frac{2T^M_{OX} + A}{B}\right)\Delta T^{MM}_{OX} \quad (5)$$

$$\Delta t^M = \left(\frac{2T^M_{OX} + A}{B}\right)\Delta T^M_{OX} \quad (6)$$

$$\Delta t = \max\{\Delta t^M, \min(\Delta t^P \times R, \Delta t^M)\} \quad (7).$$

Furthermore, a process simulator, as recited in claim 3 of the present invention, is featured by such a process simulator for simulating an oxidation process in a step for manufacturing a semiconductor device, comprising: first means in which a two-dimensional Laplace equation related to an oxidizing agent diffusion within an oxide film is solved to thereby calculate oxidizing agent concentration $C^S_{OX}$ at a boundary surface between an oxide film/a silicon substrate; second means in which the oxidizing agent density $C^S_{OX}$ is substituted for the below-mentioned formula (8) so as to calculate an effective film thickness of the oxide film as to all of a plurality of preset modes on the boundary surface between the oxide film/the silicon substrate; the formula (8) is defined by such that equilibrium oxidizing agent concentration within the oxide film is "C*", an oxidation reaction coefficient at the boundary surface between the oxide film/the silicon substrate is "k", a mass transfer coefficient at a boundary surface between an atmosphere/an oxide film is "h", a diffusion coefficient of an oxidizing agent within the oxide film is "D", and a parameter related to an oxidation speed is equal to "A" given by the below-mentioned formula (9):

$$T_{OX}^E = \frac{A}{2} \cdot \frac{\frac{h}{h+k} \cdot C^* - C_{OX}^S}{C_{OX}^S}, \text{ and} \quad (8)$$

$$A = 2D\left(\frac{1}{h} + \frac{1}{k}\right); \quad (9)$$

third means for calculating a minimum value $T^M_{OX}$ of the film thickness $T^E_{OX}$; and fourth means in which both the minimum value $T^M_{OX}$ and a desirable film thickness increase amount $\Delta T_{OX}$ of the oxide film per a time step $\Delta t$ are substituted for the below-mentioned formula (10) to thereby calculate the time step "$\Delta t$", the time step "$\Delta t$" being equal to unit time of the oxidizing agent diffusion within the oxide film in the oxidation process;

$$\Delta t = \left(\frac{2T_{OX}^M + A}{B}\right)\Delta T_{OX}, \quad (10)$$

wherein: another parameter B related to an oxidation speed, expressed in a right hand of the above-described formula (10), is given by the below-mentioned formula (11), and symbol "$N_1$" shown in a right hand of the below-mentioned formula (11) is a parameter determined by an oxidation sort:

$$B = \frac{2DC^*}{N_1}. \quad (11)$$

Also, to achieve the above-described object, a process simulator, as recited in claim 4 of the present invention, is featured by the process simulator according to claim 3 wherein: the process simulator is comprised of, instead of the fourth means, fifth means in which the minimum value $T^M_{OX}$, a maximum film thickness increase amount $\Delta T^{MM}_{OX}$ and also a minimum film thickness increase amount $\Delta T^M_{OX}$ with respect to the oxide film thickness increase amount $\Delta T_{OX}$, and a preceding time step $\Delta t^P$ are substituted for the below-mentioned formula (12) related to a maximum time step $\Delta t^{MM}$, the below-described formula (13) related to a minimum time step $\Delta t^M$, and the below-mentioned formula (14) directed to such a time step $\Delta t$ which should be calculated when a ratio of a present time step to the preceding time step $\Delta t^P$ is assumed as "R", whereby the time step $\Delta t$ is calculated:

$$\Delta t^{MM} = \left(\frac{2T_{OX}^M + A}{B}\right)\Delta T_{OX}^{MM} \quad (12)$$

$$\Delta t^M = \left(\frac{2T_{OX}^M + A}{B}\right)\Delta T_{OX}^M \quad (13)$$

$$\Delta t = \max\{\Delta t^M, \min(\Delta t^P \times R, \Delta t^M)\} \quad (14).$$

Also, to achieve the above-described object, a process simulator, as recited in claim 5 of the present invention, is featured by the process simulator according to claim 3 wherein: the process simulator is arranged by a computer including at least: a memory unit for previously storing thereinto a program to simulate the oxidation process of the semiconductor device manufacturing step; and a central processing unit for controlling the operations of the first to fourth means, and the memory unit.

Moreover, a recording medium, as recited in claim 6 of the present invention, is featured by such a recording medium for recording thereon a process simulation program used to simulate an oxidation process in a step for manufacturing a semiconductor device, wherein: the process simulation program causes a computer to execute: a first step in which a two-dimensional Laplace equation related to an oxidizing agent diffusion within an oxide film is solved to thereby calculate oxidizing agent concentration $C^S_{OX}$ at a boundary surface between an oxide film/a silicon substrate; a second step in which the oxidizing agent density $C^S_{OX}$ is substituted for the below-mentioned formula (15) so as to calculate an effective film thickness of the oxide film as to all of a plurality of preset modes on the boundary surface between the oxide film/the silicon substrate; the formula (15) is defined by such that equilibrium oxidizing agent concentration within the oxide film is "C*", an oxidation reaction coefficient at the boundary surface between the oxide film/the silicon substrate is "k", a mass transfer coefficient at a boundary surface between an atmosphere/an oxide film is "h", a diffusion coefficient of an oxidizing agent within the oxide film is "D", and a parameter related to an oxidation speed is equal to "A" given by the below-mentioned formula (16):

$$T_{OX}^E = \frac{A}{2} \cdot \frac{\frac{h}{h+k} \cdot C^* - C_{OX}^S}{C_{OX}^S}, \text{ and} \quad (15)$$

$$A = 2D\left(\frac{1}{h} + \frac{1}{k}\right); \quad (16)$$

a third step for calculating a minimum value $T^M_{OX}$ of the film thickness $T^E_{OX}$; and a fourth step in which both the minimum value $T^M_{OX}$ and a desirable film thickness increase amount $\Delta T_{OX}$ of the oxide film per a time step $\Delta t$ are substituted for the below-mentioned formula (17) to thereby calculate the time step "$\Delta t$", the time step "$\Delta t$" being equal to unit time of the oxidizing agent diffusion within the oxide film in the oxidation process;

$$\Delta t = \left(\frac{2T_{OX}^M + A}{B}\right)\Delta T_{OX}, \quad (17)$$

wherein: another parameter B related to an oxidation speed, expressed in a right hand of the above-described formula (17), is given by the below-mentioned formula (18), and symbol "$N_1$" shown in a right hand of the below-mentioned formula (18) is a parameter determined by an oxidation sort:

$$B = \frac{2DC^*}{N_1}. \quad (18)$$

Also, to achieve the above-described object, a recording medium, as recited in claim 7 of the present invention, is featured by the recording medium for recording thereon a process simulation program, according to claim 6, wherein: the process simulating method is comprised of, instead of the fourth step, a fifth step in which the minimum value $T^M_{OX}$, a maximum film thickness increase amount $\Delta T^{MM}_{OX}$ and also a minimum film thickness increase amount $\Delta T^M_{OX}$ with respect to the oxide film thickness increase amount $\Delta T_{OX}$, and a preceding time step $t^P$ are substituted for the below-mentioned formula (19) related to a maximum time step $\Delta t^{MM}$, the below-described formula (20) related to a minimum time step $\Delta t^M$, and the below-mentioned formula (21) directed to such a time step $\Delta t$ which should be calculated when a ratio of a present time step to the preceding time step $\Delta t^P$ is assumed as "R", whereby the time step $\Delta t$ is calculated:

$$\Delta t^{MM} = \left(\frac{2T^M_{OX} + A}{B}\right)\Delta T^{MM}_{OX} \tag{19}$$

$$\Delta t^M = \left(\frac{2T^M_{OX} + A}{B}\right)\Delta T^M_{OX} \tag{20}$$

$$\Delta t = \max\{\Delta t^M, \min(\Delta t^P \times R, \Delta t^M)\} \tag{21}$$

BRIEF DESCRIPTION OF THE DRAWINGS

The above and further objects, novel features and advantages of the present invention will more fully become obvious upon an understanding of the following detailed description taken in connection with the accompanying drawings, in which.

DETAILED DESCRIPTION OF THE PREFERRED EMBODIMENT

Referring now to drawings, various preferred embodiments of the present invention will be described in detail.

FIRST PROCESS SIMULATING METHOD

Figure 1:
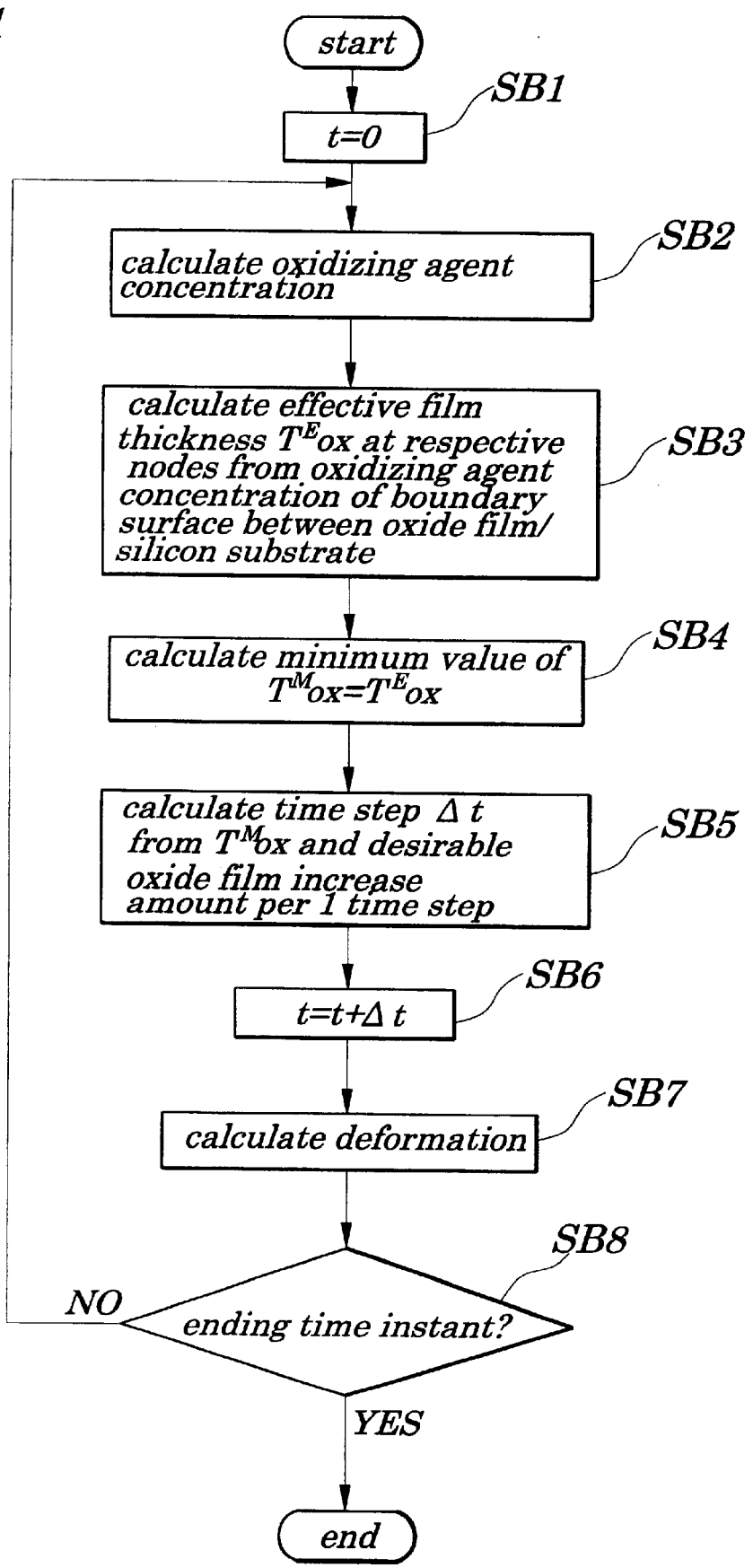
FIG. 1 is a flow chart for describing a process simulating method according to a first embodiment of the present invention.

FIG. 1 is a flow chart for describing a process simulating method according to a first preferred embodiment of the present invention. It should be understood that this first process simulating method is installed as a process simulation program into a process simulator for a utilization purpose.

The process simulator is arranged by employing a computer containing a CPU (central processing unit), an internal storage apparatus such as a ROM (read-only memory) and a RAM (random access memory), and an external storage apparatus such as an FDD (floppy disk drive), a HDD (hard disk drive), and a CD-ROM (compact disk-ROM) driver. This computer further contains an input device such as a keyboard and a mouse, and also a display device. This process simulator is furthermore constituted by other data processing apparatus. The above-described process simulating method is recorded as a process simulation program on such a recording medium as an FD (floppy disk) and an HD (hard disk), and also a CD-ROM. This recording medium may be realized by employing a semiconductor memory, for instance, a ROM.

Figure 2:
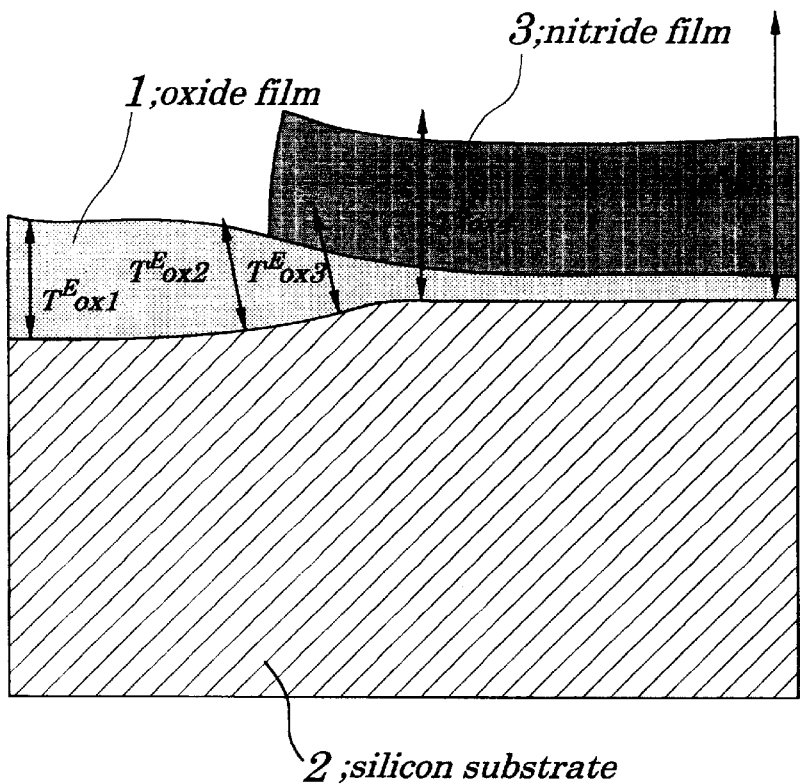
FIG. 2 illustratively shows an example of an effective film thickness $T^E_{OX}$ of an oxide film in a semiconductor element having a LOCOS structure according to the first embodiment.

Referring now to FIG. 1 and FIG. 2, a description will be made of operations of the process semiconductor with employment of the above-described arrangement.

In the flow chart of FIG. 1, at a first step SB1, a time instant variable "t" used to count up a time elapse in the oxidation process is set to zero. Subsequently, the simulating operation is advanced to a step SB2.

At this step SB2, the Laplace equation indicated in the above-described formula (24) as to an oxide film 1 is solved to calculate oxidizing agent density $C^S_{OX}$ at a boundary surface between an oxide film/a silicon substrate. Then, the simulating operation is advanced to a further step SB3.

At the step SB3, the value of the oxidizing agent density $C^S_{OX}$ is entered into a formula (47) so as to calculate an effective film thickness $T^E_{OX}$ of the oxide film 1 over all of nodes on the boundary surface between the oxide film/the silicon substrate. Thereafter, this simulating process is advanced to a step SB4. It should be noted that the method for determining the node is described in, for instance, Japanese Unexamined Patent Application No. 9-017738 opened in 1997. In the above-described formula (47), symbol "C*" indicates equilibrium oxidizing agent density within the oxide film 1, symbol "k" shows an oxidation reaction coefficient at the boundary surface between the oxide film/the silicon substrate, depending upon a temperature, and symbol "h" represents a mass transfer coefficient at a boundary surface between an atmosphere/the oxide film 1, depending upon a temperature. Similar to the above-described formulae (22) and (23), symbol "A" indicates a parameter related to an oxidation speed. This oxidation speed "A" is given by the below-mentioned formula (48). In this formula (48), symbol "D" denotes an oxidation agent diffusion coefficient within the oxide film 1, depending upon a temperature.

$$T^E_{OX} = \frac{A}{2} \cdot \frac{\frac{h}{h+k} \cdot C^* - C^S_{OX}}{C^S_{OX}} \tag{47}$$

$$A = 2D\left(\frac{1}{h} + \frac{1}{k}\right) \tag{48}$$

Now, a method for conducting the above-described formula (47) will be explained. A growing speed of the oxide film 1 is directly proportional to a flux of an oxidizing agent such as $O_2$ and $H_2O$ at the boundary surface between the oxide film/the silicon substrate. In a primary oxidation model, a flux $F_1$ of an oxidation agent at the boundary surface between the atmosphere/the oxide film, a flux $F_2$ of an oxidation agent within the oxide film 1, and a flux $F_3$ of an oxidation agent at the boundary surface between the oxide film/silicon substrate are reserved. In other words, the following formula (49) can be satisfied:

$$F_1 = F_2 = F_3 \tag{49}$$

The growing speed of the oxide film 1, the flux $F_1$, the flux $F_2$, and the flux $F_3$ are given in accordance with the below-mentioned formulae (50) to (53). In these formulae (50) to (53), symbol "N" shows a parameter, and symbol "$C_{OX}$" represents oxidizing agent density at the boundary surface between the atmosphere/the oxide film 1.

$$\frac{dT_{OX}^E}{dt} = \frac{F_3}{N} \quad (50)$$

$$F_1 = h(C^* - C_{OX}) \quad (51)$$

$$F_2 = -D\frac{\partial C}{\partial X} = D\frac{C_{OX} - C_{OX}^S}{T_{OX}^E} \quad (52)$$

$$F_3 = kC_{OX}^S \quad (53)$$

Since $F_2 = F_3$ can be satisfied based upon the above-explained formula (49), the following formula (54) is obtained from the right hand of the above-described formula (52) and the right hand of the above-described formula (53):

$$C_{ox} = \frac{kT_{OX}^E + D}{D} C_{OX}^S \quad (54)$$

Since $F_1 = F_2$ can be satisfied based upon the above-explained formula (49), the following formula (55) is obtained from the right hand of the above-described formula (51) and the right hand of the above-described formula (52):

$$DC_{OX}^S = -hT_{OX}^E C^* + (hT_{OX}^E D)C_{OX} \quad (55)$$

As a consequence, when the formula (54) is substituted for the formula (55) to be rearranged as to the effective film thickness $T_{OX}^E$ of the oxide film 1, the above-described formula (47) is obtained.

Referring to the simulating operation by the process simulator, a minimum value $T_{OX}^M$ is calculated from the effective film thickness $T_{OX}^E$ of the oxide film 1 at a step SB4, which has been calculated on the boundary surface between the oxide film/silicon substrate. Then, this simulating process is advanced to a further step SB5.

At this step SB5, both the effective minimum value $T_{OX}^M$ of the film thickness of the oxide film 1 and a desirable film thickness increase amount $\Delta T_{OX}$ of the oxide film 1 per 1 time step "$\Delta t$" are substituted for the below-mentioned formula (56) so as to calculate a time step "$\Delta t$". Thereafter, the simulating process is advanced to a step SB6.

$$\Delta t = \left(\frac{2T_{OX}^M + A}{B}\right)\Delta T_{OX} \quad (56)$$

It should be understood that similar to the above-described formulae (22) and (23), symbols "A" and "B" show parameters related to oxidation speeds, depending upon temperatures. The parameter "A" is given by the formula (48), whereas the parameter "B" is given by the formula (57). Also, symbol "$N_1$" of a right hand of the below-mentioned formula (57) represents a parameter determined based upon an oxidation sort.

$$B = \frac{2DC^*}{N_1} \quad (57)$$

At a step SB6, a time instant "t" is advanced only by the time step $\Delta t$. In other words, after the time step $\Delta t$ is added to the time instant variable "t", this simulating process is advanced to a step SB7.

At this step SB7, after a calculation is made of deformation in the shape of the oxidation film as to the time instant "t", the simulating process is advanced to a further step SB8.

At this step SB8, a judgment is made as to whether or not the time instant "t" reaches an ending time instant of the oxidation process. If the judgment result is "NO", then the simulating process is returned to the step SB2, at which the process operations defined from the step SB2 to the step SB7 are repeatedly performed. Then, in the case that the time instant "t" has reached the ending time instant of the oxidation process, since the judgement result of the step SB8 becomes "YES", a series of simulation work is accomplished.

As previously explained, in accordance with the process simulating method of this first embodiment, even when the respective elements for constituting the semiconductor device own arbitrary shapes, the time step "$\Delta t$" can be calculated based upon the minimum value $T_{OX}^M$ of the effective film thickness of the oxide film 1.

FIG. 2 illustratively indicates an example of the effective film thickness $T_{OX}^E$ (indicated by arrows) of the oxide film 1 at all of the nodes on the boundary surface between the oxide film/the silicon substrate as to the oxidation process simulation in the respective elements of the semiconductor device having the LOCOS structure. As can be seen from this drawing, an effective film thickness $T_{OX1}^E$ of the oxide film 1 at a side wall portion of the LOCOS structure is made coincident with the actual film thickness of the oxide film 1 in the side wall portion of the LOCOS structure. On the other hand, since the oxidizing agent is not diffused under a nitride film 3, the oxidizing agent concentration at the boundary surface between the oxidation film/the silicon substrate is decreased, and an effective film thickness $T_{OX5}^E$ of the oxide film 1 under the nitride film 3 becomes thicker than the actual film thickness of the oxide film 1.

Figure 3:
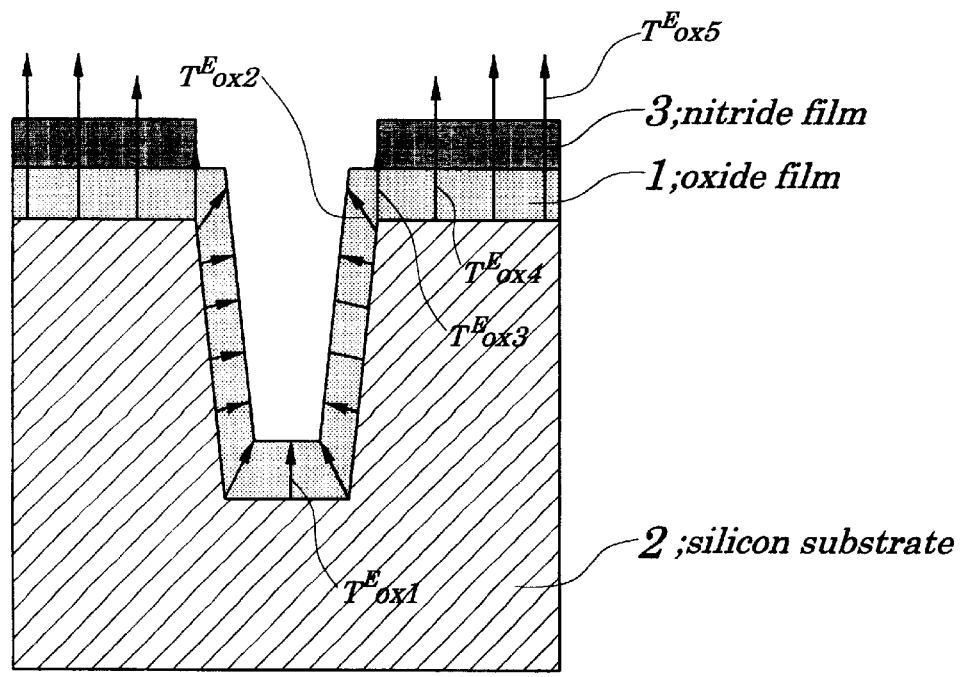
FIG. 3 illustratively represents another example of an effective film thickness $T^E_{OX}$ of an oxide film in a semiconductor element having a trench shape according to the first embodiment.

FIG. 3 illustratively indicates an example of the effective film thickness $T_{OX}^E$ (indicated by arrows) of the oxide film 1 at all of the nodes on the boundary surface between the oxide film/the silicon substrate as to the oxidation process simulation in the respective elements of the semiconductor device having the trench structure. As can be seen from this drawing, an effective film thickness $T_{OX1}^E$ of the oxide film 1 at such a trench portion where the nitride film 3 is not present is made coincident with the actual film thickness of the oxide film 1. On the other hand, since the oxidizing agent is not diffused under the nitride film 3, the oxidizing agent concentration at the boundary surface between the oxidation film/the silicon substrate is decreased, and an effective film thickness $T_{OX5}^E$ of the oxide film 1 under the nitride film 3 becomes thicker than the actual film thickness of the oxide film 1.

SECOND PROCESS SIMULATING METHOD

Figure 4:
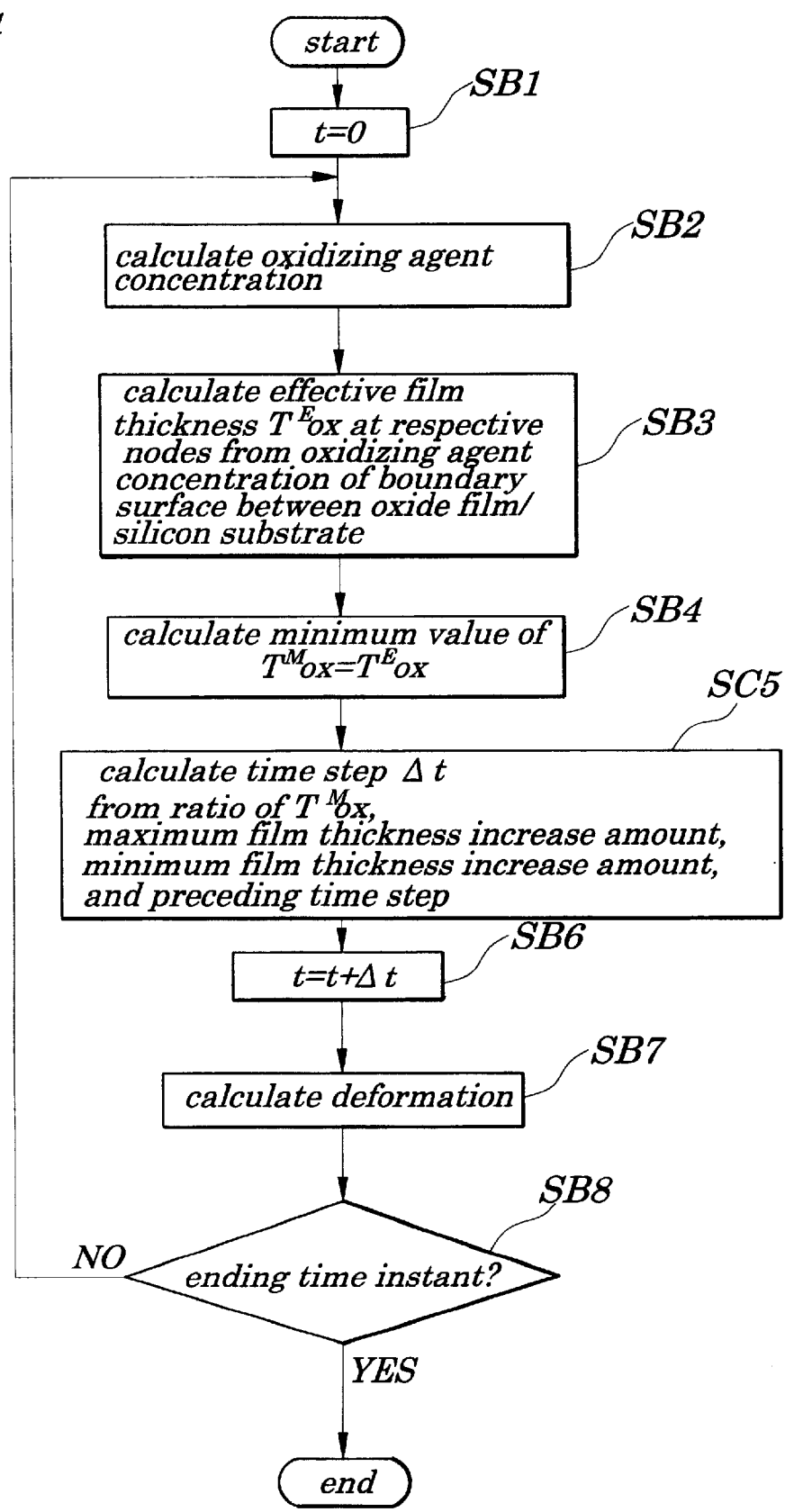
FIG. 4 is a flow chart for describing a process simulating method according to a second embodiment of the present invention.
Figure 5:
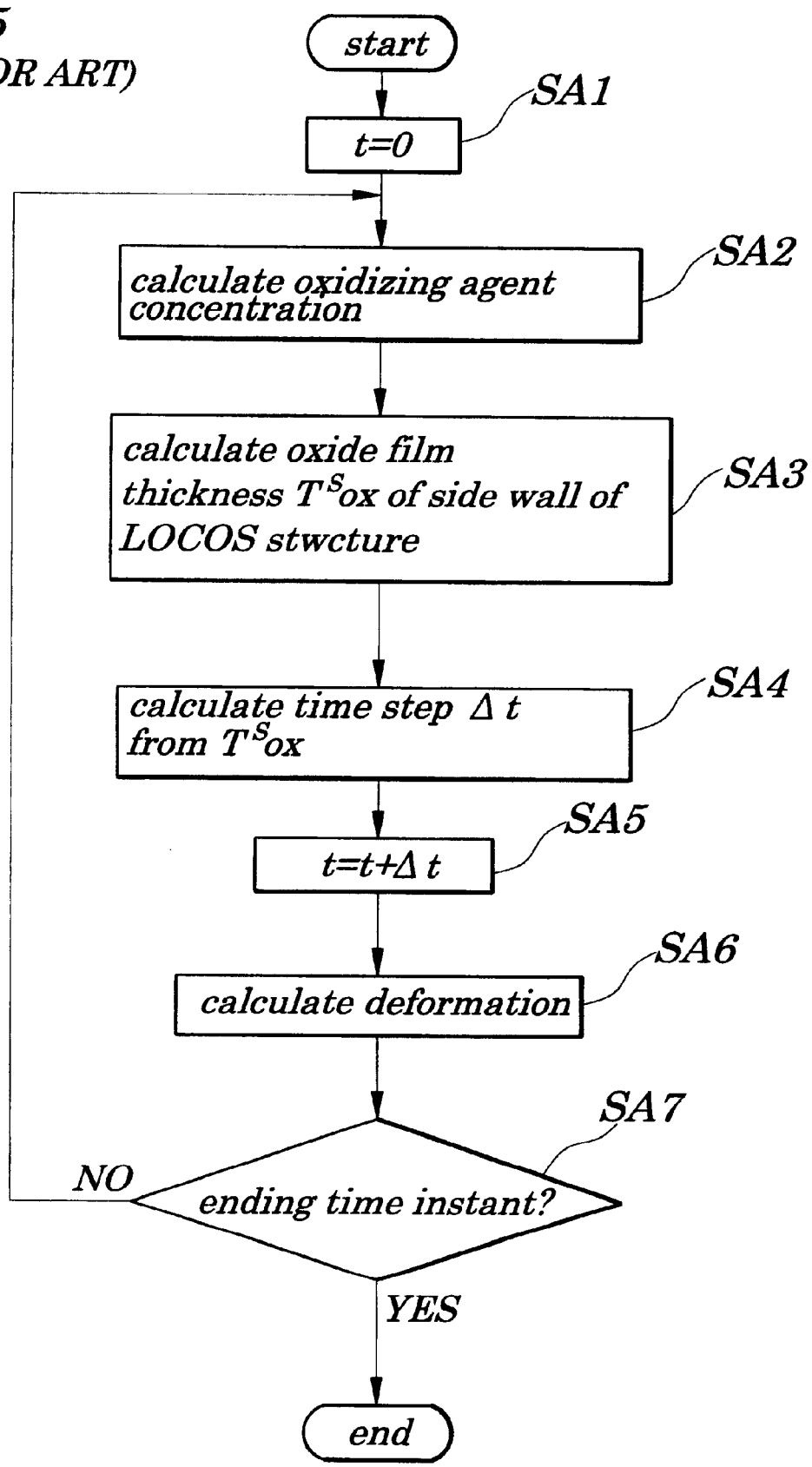
FIG. 5 is a flow chart for explaining one example of the conventional process simulating method.
Figure 6:
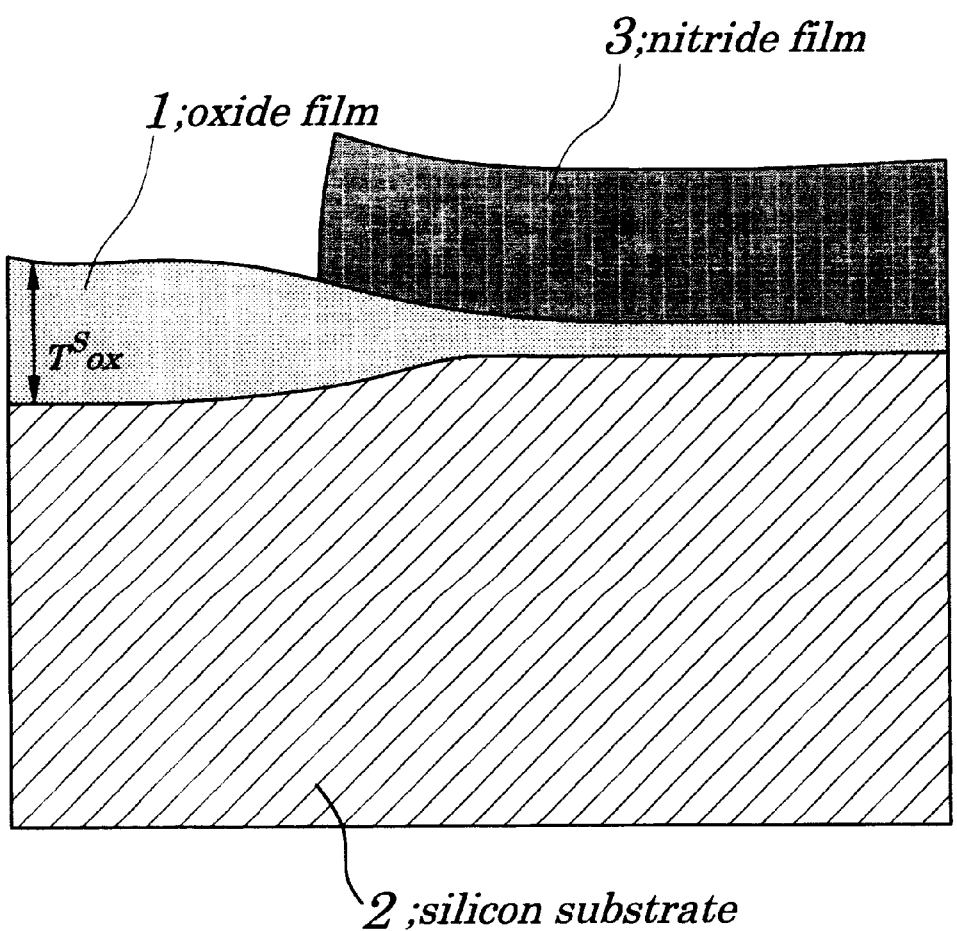
FIG. 6 is an explanatory diagram for explaining the problems of the conventional process simulating method.

Next, a second embodiment will now be explained. FIG. 4 is a flow chart for describing a process simulating method according to this second embodiment of the present invention. This process simulating method of the second embodiment is different from the above-explained process simulating method of the first embodiment with respect only to a step SC5 instead of the above-explained step SB5. Accordingly, only this different step SC5 will be explained in the following description.

That is, at this step SC5, the following calculations are carried out. The minimum value $T_{OX}^M$ of the effective film thickness of the oxide film 1, a maximum film thickness increase amount $\Delta T^{MM}{}_{OX}$ and a minimum film thickness increase amount $\Delta T^{M}{}_{OX}$ with respect to a desirable oxide film thickness increase amount $\Delta T_{OX}$, and a preceding time step $\Delta t^P$ are substituted for the below-mentioned formula (58) related to a maximum time step $\Delta t^{MM}$, the below-mentioned formula (59) concerning a minimum time step $\Delta t^M$, and the above-mentioned formula (53) related to the time step $\Delta t$ to be calculated, respectively, to obtain a time step $\Delta t$. Thereafter, the simulating process is advanced to a step SB6. Also, in the below-explained formula (60), symbol "R" indicates a ratio of the present time step to the preceding time step.

$$\Delta t^{MM} = \left(\frac{2T^M_{OX} + A}{B}\right)\Delta T^{MM}_{OX} \tag{58}$$

$$\Delta t^{M} = \left(\frac{2T^M_{OX} + A}{B}\right)\Delta T^{M}_{OX} \tag{59}$$

$$\Delta t = \max\{\Delta t^M, \min(\Delta t^P \times R, \Delta t^M)\} \tag{60}$$

As previously described, in accordance with the process simulating method of the second embodiment, the desirable oxide film thickness increase amount $\Delta T_{OX}$ can be restricted into such a range between the minimum film thickness increase amount $\Delta T^M{}_{OX}$ and the maximum film thickness increase amount $T^{MM}{}_{OX}$. Also, since the time step $\Delta t$ can be increased/decreased with reference to the preceding time step $\Delta t^P$, the high precession analysis can be obtained.

While the present invention has been described with reference to the drawings, the present invention is not limited to the above-described embodiments, but may be modified, changed, and substituted without departing from the technical spirit and scope of the present invention.

As previously described in detail, in accordance with the process simulating method, the process simulator, and the recording medium for recording the process simulation program of the present invention, there are advantages as follows. That is, the effective film thicknesses of the oxide film 1 as to the respective nodes on the boundary surface between the oxide film/the silicon substrate are calculated. Based upon the minimum film thickness of the oxide film 1, the unit time (time step) of the oxidizing agent diffusion within the oxide film 1 in the oxidation process can be calculated. Even when the respective elements for constituting the semiconductor device such as the LSI own the arbitrary shapes, the time step can be properly calculated.

As a consequence, the simulation in the oxidation process can be realized in a high speed and in high precision.

It is thus apparent that the present invention should by no means be limited to the illustrated embodiment and various modification and changes may be suggested without departing from the scope and spirit of the invention.

Finally, the present application claims the priority of Japanese Patent Application No. Hei9-193893 filed on Jul. 18, 1997, which is herein incorporated by reference.

What is claimed is:

1. A process simulating method for simulating an oxidation process in a step for manufacturing a semiconductor device, comprising:

a first step in which a two-dimensional Laplace equation related to an oxidizing agent diffusion within an oxide film is solved to thereby calculate an oxidizing agent concentration $C_{OX}{}^S$ at a boundary surface between an oxide film and a silicon substrate of said semiconductor device;

a second step in which said oxidizing agent concentration $C_{OX}{}^S$ is substituted for the below-mentioned formula (1) so as to calculate an effective film thickness of the oxide film for a plurality of preset nodes on said boundary surface between the oxide film and the silicon substrate;

wherein said formula (1) is defined such that an equilibrium oxidizing agent concentration within said oxide film is "C*", an oxidation reaction coefficient at the boundary surface between the oxide film and the silicon substrate is "k", a mass transfer coefficient at a boundary surface between an atmosphere and an oxide film is "h", a diffusion coefficient of an oxidizing agent within said oxide film is "D", and a first parameter related to an oxidation speed is equal to "A" given by the below-mentioned formula (2):

$$T^E_{OX} = \frac{A}{2} \cdot \frac{\frac{h}{h+k} \cdot C^* - C^S_{OX}}{C^S_{OX}}, \text{ and} \tag{1}$$

$$A = 2D\left(\frac{1}{h} + \frac{1}{k}\right); \tag{2}$$

a third step in which a minimum value $T_{OX}{}^M$ of said film thickness $T_{OX}{}^E$ is calculated; and a fourth step in which both said minimum value $T_{OX}{}^M$ and a desirable film thickness increase amount $\Delta T_{OX}$ of the oxide film per a time step t are substituted for the below-mentioned formula (3) to thereby calculate said time step t, said time step t being equal to unit time of the oxidizing agent diffusion within the oxide film in the oxidation process;

$$\Delta t = \left(\frac{2T^M_{OX} + A}{B}\right)\Delta T_{OX}, \tag{3}$$

wherein a second parameter B related to an oxidation speed, expressed in a right hand of the above-described formula (3), is given by the below-mentioned formula (4), and a symbol "$N_1$" shown in a right hand of the below-mentioned formula (4) is a parameter determined by an oxidation sort:

$$B = \frac{2DC^*}{N_1}. \tag{4}$$

2. The process simulating method according to claim 1 wherein:

said process simulating method is comprised of, instead of said fourth step, a fifth step in which said minimum value $T_{OX}{}^M$, a maximum film thickness increase amount $\Delta T_{OX}{}^{MM}$ and a minimum film thickness increase amount $\Delta T_{OX}{}^M$ with respect to said oxide film thickness increase amount $\Delta T_{OX}$, and a preceding time step $\Delta t^P$ are substituted for the below-mentioned formula (5) related to the maximum time step $\Delta t^{MM}$, the below-described formula (6) related to a minimum time step $\Delta t^M$, and the below-mentioned formula (7) directed to such a time step t which should be calculated when a ratio of a present time step to the preceding time step $\Delta t^P$ is assumed as "R", whereby said time step $\Delta t$ is calculated:

$$\Delta t^{MM} = \left(\frac{2T_{OX}^M + A}{B}\right)\Delta T_{OX}^{MM} \qquad (5)$$

$$\Delta t^M = \left(\frac{2T_{OX}^M + A}{B}\right)\Delta T_{OX}^M \qquad (6)$$

$$\Delta t = \max\{\Delta t^M, \min(\Delta t^P \times R, \Delta t^M)\} \qquad (7)$$

3. A process simulator for simulating an oxidation process in a step for manufacturing a semiconductor device, comprising:

first simulation device in which a two-dimensional Laplace equation related to an oxidizing agent diffusion within an oxide film is solved to thereby calculate an oxidizing agent concentration $C_{OX}^S$ at a boundary surface between an oxide film and a silicon substrate of said semiconductor device;

second simulation device in which said oxidizing agent concentration $C_{OX}^S$ is substituted for the below-mentioned formula (8) to calculate an effective film thickness of the oxide film as to all of a plurality of preset nodes on said boundary surface between the oxide film and the silicon substrate;

said formula (8) is defined by such that equilibrium oxidizing agent concentration within said oxide film is "$C^*$", an oxidation reaction coefficient at the boundary surface between the oxide film and the silicon substrate is "k", a mass transfer coefficient at a boundary surface between an atmosphere and an oxide film is "h", a diffusion coefficient of an oxidizing agent within said oxide film is "D", and a first parameter related to an oxidation speed is equal to "A" given by the below-mentioned formula (9):

$$T_{OX}^E = \frac{A}{2} \cdot \frac{\frac{h}{h+k} \cdot C^* - C_{OX}^S}{C_{OX}^S}, \text{ and} \qquad (8)$$

$$A = 2D\left(\frac{1}{h} + \frac{1}{k}\right); \qquad (9)$$

third simulation device that calculates a minimum value $T_{OX}^M$ of said film thickness $T_{OX}^E$; and fourth simulation device in which both said minimum value $T_{OX}^M$ and a desirable film thickness increase amount $\Delta T_{OX}$ of the oxide film per a time step t are substituted for the below-mentioned formula (10) to thereby calculate said time step t, said time step t being equal to unit time of the oxidizing agent diffusion within the oxide film in the oxidation process;

$$\Delta t = \left(\frac{2T_{OX}^M + A}{B}\right)\Delta T_{OX} \qquad (10)$$

wherein a second parameter B related to an oxidation speed of said semiconductor device, expressed in a right hand of the above-described formula (10), is given by the below-mentioned formula (11), and a symbol "$N_1$" shown in a right hand of the below-mentioned formula (11) is a parameter determined by an oxidation sort:

$$B = \frac{2DC^*}{N_1}. \qquad (11)$$

4. The process simulator according to claim 3, wherein:

said process simulator is comprised of, instead of said fourth simulation device, fifth simulation device in which said minimum value $T_{OX}^M$, a maximum film thickness increase amount $\Delta T_{OX}^{MM}$ and also a minimum film thickness increase amount $\Delta T_{OX}^M$ with respect to said oxide film thickness increase amount $\Delta T_{OX}$, and a preceding time step $\Delta t^P$ are substituted for the below-mentioned formula (12) related to a maximum time step $\Delta t^{MM}$, the below-described formula (13) related to a minimum time step $\Delta t^{MM}$, and the below-mentioned formula (14) directed to such a time step t which should be calculated when a ratio of a present time step to the preceding time step $\Delta t^P$ is assumed as "R", whereby said time step t is calculated:

$$\Delta t^{MM} = \left(\frac{2T_{OX}^M + A}{B}\right)\Delta T_{OX}^{MM} \qquad (12)$$

$$\Delta t^M = \left(\frac{2T_{OX}^M + A}{B}\right)\Delta T_{OX}^M \qquad (13)$$

$$\Delta t = \max\{\Delta t^M, \min(\Delta t^P \times R, \Delta t^M)\} \qquad (14)$$

5. The process simulator according to claim 3 wherein:

said process simulator is arranged by a computer including:
 a memory unit that previously stores thereinto a program to simulate said oxidation process of the semiconductor device manufacturing step; and
 a central processing unit that controls the operations of said first to fourth simulation devices and said memory unit.

6. A recording medium for recording thereon a process simulation program used to simulate an oxidation process in a step for manufacturing a semiconductor device, wherein said process simulation program causes a computer to execute:

a first step in which a two-dimensional Laplace equation related to an oxidizing agent diffusion within an oxide film is solved to thereby calculate an oxidizing agent concentration $C_{OX}^S$ at a boundary surface between an oxide film and a silicon substrate of said semiconductor device;

a second step in which said oxidizing agent concentration $C_{OX}^S$ is substituted for the below-mentioned formula (15) as to calculate an effective film thickness of the oxide film for a plurality of preset nodes on said boundary surface between the oxide film and the silicon substrate;

wherein said formula (15) is defined by such that equilibrium oxidizing agent concentration within said oxide film is "$C^*$", an oxidation reaction coefficient at the boundary surface between the oxide film and the silicon substrate is "k", a mass transfer coefficient at a boundary surface between an atmosphere and an oxide film is "h", a diffusion coefficient of an oxidizing agent within said oxide film is "D", and a first parameter related to an oxidation speed is equal to "A" given by the below-mentioned formula (16)

$$T_{OX}^E = \frac{A}{2} \cdot \frac{\frac{h}{h+k} \cdot C^* - C_{OX}^S}{C_{OX}^S}, \text{ and} \quad (15)$$

$$A = 2D\left(\frac{1}{h} + \frac{1}{k}\right); \quad (16)$$

a third step in which a minimum value $T_{OX}^M$ of said film thickness $T_{OX}^E$; and a fourth step in which both said minimum value $T_{OX}^M$ and a desirable film thickness increase amount $\Delta T_{OX}$ of the oxide film per a time step t are substituted for the below-mentioned formula (10) to thereby calculate said time step t, said time step t being equal to unit time of the oxidizing agent diffusion within the oxide film in the oxidation process;

$$\Delta t = \left(\frac{2T_{OX}^M + A}{B}\right)\Delta T_{OX} \quad (17)$$

wherein a second parameter B related to an oxidation speed, expressed in a right hand of the above-described formula (17), is given by the below-mentioned formula (18), and a symbol "$N_1$" shown in a right hand of the below-mentioned formula (18) is a parameter determined by an oxidation sort:

$$B = \frac{2DC^*}{N_1}. \quad (18)$$

7. The recording medium for recording thereon a process simulation program, according to claim 6, wherein:

said process simulating method is comprised of, instead of said fourth step, a fifth step in which said minimum value $T_{OX}^M$, a maximum film thickness increase amount $\Delta T_{OX}^{MM}$ and a minimum film thickness increase amount $\Delta T_{OX}^M$ with respect to said oxide film thickness increase amount $\Delta T_{OX}$, and a preceding time step $\Delta t^P$ are substituted for the below-mentioned formula (19) related to a maximum time step $\Delta t^{MM}$, the below-described formula (20) related to a minimum time step $\Delta t^{MM}$, and the below-mentioned formula (21) directed to such a time step t which should be calculated when a ratio of a present time step to the preceding time step $\Delta t^P$ is assumed as "R", whereby said time step t is calculated:

$$\Delta t^{MM} = \left(\frac{2T_{OX}^M + A}{B}\right)\Delta T_{OX}^{MM} \quad (19)$$

$$\Delta t^M = \left(\frac{2T_{OX}^M + A}{B}\right)\Delta T_{OX}^M \quad (20)$$

$$\Delta t = \max\{\Delta t^M, \min(\Delta t^P \times R, \Delta t^M)\} \quad (21),$$

wherein said process is utilized in a utilization purpose comprising said step of manufacture of a semiconductor device.

8. A computer-readable medium, to be executed by a computer, that stores a computer program for simulating an oxidation process for a system including a silicon substrate, an oxide film and a nitride film, said computer program causing said computer to perform the steps of:

setting a time "t" of oxidation calculation equal to zero;

calculating an oxidizing agent concentration at a boundary surface between said oxide film and said silicon substrate;

generating values of an effective film thickness of said oxide film over corresponding nodes on said boundary surface, in accordance with said oxidizing agent concentration, wherein each of said values of said effective film thickness corresponds to an actual film thickness of said oxide film;

producing a time step in accordance with a minimum value of said values of said effective film thickness;

forwarding said time "t" by said time step to produce a forwarded time;

calculating a deformation of said oxidation film at said forwarded time; and repeating a loop comprising said sequential second to sixth steps until a predetermined end time of oxidation calculation is reached.

9. The computer-readable medium of claim 8, said producing step comprising calculating said time step in accordance with said minimum value, a desirable film thickness increase rate, and a speed of oxidation parameter.

10. The computer-readable medium of claim 8, said producing step comprising calculating said time step in accordance with said minimum value, a maximum film thickness increase amount, a minimum effective film thickness amount, and a speed of oxidation for said time and a preceding time.

11. The computer-readable medium of claim 8, wherein said calculating step comprises calculating said oxidizing agent concentration according to a two-dimensional Laplace equation for an oxidizing agent diffusion within said oxide film.

12. The computer-readable medium of claim 8, wherein said generating step comprises calculating said effective minimum time value according to $$T_{OX}^E = \frac{A}{2} \cdot \frac{\frac{h}{h+k} \cdot C^* - C_{OX}^S}{C_{OX}^S},$$

wherein $T_{OX}^E$ represents said effective film thickness, an equilibrium oxidizing agent concentration within said oxide film is "$C^*$", an oxidation reaction coefficient at the boundary surface between said oxide film and said silicon substrate is "k", a mass transfer coefficient at a boundary surface between an atmosphere and an oxide film is "h", a diffusion coefficient of an oxidizing agent within said oxide film is "D", and a first parameter related to an oxidation speed is equal to $$\text{"}A\text{" is } 2D\left(\frac{1}{h} + \frac{1}{k}\right).$$

13. The computer-readable medium of claim 8, wherein said computer program is applied to a non-local oxidation of silicon structure.

14. A method of simulating oxidation of a semiconductor device in a system that includes a silicon substrate, an oxide film and a nitride film, said method comprising:

determining a time "t" of oxidation of said semiconductor device;

executing a simulation of oxidation of said semiconductor device in said system, wherein said semiconductor device employs a non-local oxidation of silicon process; and applying said simulation method to design a semiconductor device.

15. The method of claim 14, said executing step comprising:
 (a) calculating an oxidizing agent concentration at a boundary surface between said oxide film and said silicon substrate of said system;
 (b) generating effective film thickness values for each of a plurality of nodes on said boundary surface;
 (c) generating a time step in accordance with a minimum value of said effective film thickness values and a time step factor; and
 repeating steps (a)–(c) until said time "t" of oxidation calculation reaches a predetermined end time.

16. The method of claim 15, said step (a) comprising using a two-dimensional Laplace equation related to an oxidizing agent diffusion with said oxide film to calculate said oxidizing agent concentration.

17. The method of claim 15, said step (b) comprising calculating said effective film thickness values in accordance with $$T_{OX}^E = \frac{A}{2} \cdot \frac{\frac{h}{h+k} \cdot C^* - C_{OX}^S}{C_{OX}^S},$$

wherein said effective film thickness is $T_{OX}^E$, an equilibrium oxidizing agent concentration within said oxide film is "$C^*$", an oxidation reaction coefficient at the boundary surface between the oxide film and the silicon substrate is "k", a mass transfer coefficient at a boundary surface between an atmosphere and an oxide film is "h", a diffusion coefficient of an oxidizing agent within said oxide film is "D", a first parameter related to an oxidation speed is equal to "A" as represented by $$A = 2D\left(\frac{1}{h} + \frac{1}{k}\right),$$

and said oxidizing agent concentration is represented by $C_{OX}^S$.

18. The method of claim 15, said step (c) comprising calculating said time step in accordance with $$\Delta t = \left(\frac{2T_{OX}^M + A}{B}\right)\Delta T_{OX},$$

wherein said minimum value of effective film thickness values is $T_{OX}^M$ and a desirable film thickness increase rate $\Delta T_{OX}$ are applied to calculate said time step represented by t, said time step t being equal to a unit time of the oxidizing agent diffusion within the oxide film in the oxidation process, a first parameter related to an oxidation speed is equal to "A" as represented by $$A = 2D\left(\frac{1}{h} + \frac{1}{k}\right)$$

and wherein a second parameter B related to an oxidation speed, as expressed by $$B = \frac{2DC^*}{N_1},$$

an equilibrium oxidizing agent concentration within said oxide film is "C", and "$N_1$" is a parameter determined by an oxidation sort.

19. The method of claim 15, said step (c) comprising calculating said time step in accordance with $$\Delta t^{MM} = \left(\frac{2T_{OX}^M + A}{B}\right)\Delta T_{OX}^{MM},$$

$$\Delta t^M = \left(\frac{2T_{OX}^M + A}{B}\right)\Delta T_{OX}^M, \text{ and}$$

$$\Delta t = \max\{\Delta t^M, \min(\Delta t^P \times R, \Delta t^{M})\},$$

wherein said minimum value of said effective film thickness values is $T_{OX}^M$, a maximum film thickness increase amount is $\Delta T_{OX}^{MM}$ and a minimum film thickness increase amount is $\Delta T_{OX}^M$ with respect to said oxide film thickness increase amount as represented by $\Delta T_{OX}$, and a preceding time step is represented by $\Delta t^P$ and is related to a maximum time step $\Delta t^{MM}$, a minimum time step $\Delta t^M$, such that said time step $\Delta t$ is calculated when a ratio of a present time step to the preceding time step $\Delta t^P$ is represented by "R", whereby said time step $\Delta t$ is calculated.

20. The method of claim 15, further comprising calculating a deformation in a shape of said oxide film at said time "t".

* * * * *